US012640349B2

(12) United States Patent
Bera et al.

(10) Patent No.: US 12,640,349 B2
(45) Date of Patent: May 26, 2026

(54) METHOD AND APPARATUS FOR GENERATING PLASMA WITH ION BLOCKER PLATE

(71) Applicant: Applied Materials, Inc., Santa Clara, CA (US)

(72) Inventors: Kallol Bera, Fremont, CA (US); Xiaopu Li, San Jose, CA (US); Tsutomu Tanaka, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1201 days.

(21) Appl. No.: 17/491,988

(22) Filed: Oct. 1, 2021

(65) Prior Publication Data

US 2023/0107392 A1     Apr. 6, 2023

(51) Int. Cl.
*H01J 37/32* (2006.01)

(52) U.S. Cl.
CPC .. H01J 37/32422 (2013.01); H01J 37/32082 (2013.01); *H01J 2237/332* (2013.01)

(58) Field of Classification Search
CPC .......... H01J 37/32422; H01J 37/32082; H01J 2237/332
See application file for complete search history.

(56) References Cited

U.S. PATENT DOCUMENTS

| | | | |
|---|---|---|---|
| 4,158,589 A | 6/1979 | Keller et al. | |
| 9,373,517 B2 | 6/2016 | Yang et al. | |

| | | | |
|---|---|---|---|
| 10,204,795 B2 | 2/2019 | Huang et al. | |
| 11,069,514 B2 * | 7/2021 | Shah ................. | H01J 37/32697 |
| 2002/0004309 A1 | 1/2002 | Collins et al. | |
| 2005/0067099 A1 | 3/2005 | Walton et al. | |
| 2005/0184670 A1 * | 8/2005 | Lacoste ............. | H01J 37/32688 |
| | | | 315/111.41 |
| 2008/0289576 A1 | 11/2008 | Lee et al. | |

(Continued)

FOREIGN PATENT DOCUMENTS

| | | |
|---|---|---|
| JP | H06260434 A | 9/1994 |
| JP | 2012054377 A | 3/2012 |

(Continued)

OTHER PUBLICATIONS

PCT International Search Report and Written Opinion in PCT/US2022/045038 dated Jan. 20, 2023, 9 pages.

(Continued)

*Primary Examiner* — James M Mellott
(74) *Attorney, Agent, or Firm* — SERVILLA WHITNEY LLC

(57) ABSTRACT

Methods of generating a plasma in a semiconductor processing chamber comprise: applying a radio frequency (RF) power to generate a plasma in a plasma region of the processing chamber, the processing chamber containing: a showerhead, an ion blocker plate, and a substrate, and the plasma region being defined by a front surface of the showerhead and a back surface of the ion blocker plate; and applying a bias the ion blocker plate so that there is no light-up in the processing chamber. Some methods further include dynamically tuning the bias by assessing conditions of light-up or no light-up and adjusting the bias. Some methods further include applying the bias zonally.

15 Claims, 6 Drawing Sheets

(56)　　　　　　References Cited

U.S. PATENT DOCUMENTS

| | | | |
|---|---|---|---|
| 2009/0102022 A1 | 4/2009 | Kim | |
| 2013/0245969 A1* | 9/2013 | Singlevich | H01J 37/32917 |
| | | | 702/58 |
| 2017/0330744 A1 | 11/2017 | Keil et al. | |
| 2018/0230597 A1 | 8/2018 | Ma et al. | |
| 2020/0035467 A1* | 1/2020 | Shah | H01J 37/32697 |
| 2020/0319356 A1 | 10/2020 | Lea et al. | |
| 2021/0020411 A1 | 1/2021 | Savas et al. | |

FOREIGN PATENT DOCUMENTS

| | | | |
|---|---|---|---|
| JP | 2016167606 A | 9/2016 |
| KR | 20190044891 A | 5/2019 |
| WO | 2012018449 A2 | 2/2012 |
| WO | 2012142038 A1 | 10/2012 |
| WO | 2019190751 A1 | 10/2019 |

OTHER PUBLICATIONS

Machine Translation of JP2012054377, 20 pages.
Machine Translation of JPH06260434, 12 pages.

* cited by examiner

Plasma distribution by electron density. Light-up conditions.

COMPARATIVE

Plasma distribution by electron density. No light-up conditions.

Plasma distribution by electron density. No light-up conditions.

Z-Z

METHOD AND APPARATUS FOR GENERATING PLASMA WITH ION BLOCKER PLATE

TECHNICAL FIELD

The present disclosure generally relates to apparatus and methods for plasma enhanced processes in semiconductor processing chambers. In particular, embodiments of the disclosure are directed to capacitively coupled plasma (CCP) chambers with ion blocker plates that are biased to mitigate and/or eliminate light-up in ion blocker plate holes and process gap.

BACKGROUND

Many semiconductor processes involve the use of plasma to enhance films and their deposition. "Light-up" during generation of plasma can lead to non-uniformity in the films, which affects overall qualities and yields of wafers. In plasma-enhanced deposition processes, light-up in grounded ion blocker plate holes can lead to power leakage into a process volume or gap below the ion blocker plate and above a top surface of a wafer, causing localized plasma in process gap, which adversely affects process non-uniformity, especially in an edge region of the wafer. Additionally, plasma light-up can cause O-ring attack, and subsequent contamination, e.g. from fluorine (F). Therefore, an operating window of a process can be limited to avoid plasma light-up conditions for a given ion blocker plate.

Some solutions to addressing light-up include using ion blocker plates with smaller holes and/or with a larger thickness, but that can lead to other limitations during processing such as reduced conductance for radicals necessary for atomic layer deposition and correspondingly reduced film deposition rates. Moreover, such hardware choices are fixed during operation with no opportunity to adjust. Also, some solutions include the use of lower power to prevent hole light-up, which presents limited operating windows.

Generally, there is a continuing need in the art to mitigate and/or eliminate light-up during plasma processes, and to provide opportunities to adjust conditions during operation.

SUMMARY

One or more embodiments are directed to methods of generating a plasma in a semiconductor processing chamber. A radio frequency (RF) power is applied to generate a plasma in a plasma region of the processing chamber, the processing chamber containing: a showerhead, an ion blocker plate, and a substrate, and the plasma region being defined by a front surface of the showerhead and a back surface of the ion blocker plate. A bias is applied to the ion blocker plate so that there is no light-up in the processing chamber.

Additional embodiments are directed to methods of a plasma in a semiconductor processing chamber. A radio frequency (RF) power is applied to a showerhead of the processing chamber to generate a plasma in a plasma region of the processing chamber, the processing chamber containing: the showerhead, an ion blocker plate, and a substrate, the plasma region being defined by a front surface of the showerhead and a back surface of the ion blocker plate. A bias comprising direct current (DC) or low frequency radio frequency (LFRF) is applied to the ion blocker plate. The bias is modulated to achieve no light-up conditions in the processing chamber.

Further embodiments are directed to non-transitory computer readable mediums. The non-transitory computer readable mediums include instructions. When the instructions are executed by a controller of a processing chamber, the processing chamber performs operations of: applying a radio frequency (RF) power to a showerhead of the processing chamber to generate a plasma in a plasma region of the processing chamber, the processing chamber containing: the showerhead, an ion blocker plate, and a substrate, the plasma region being defined by a front surface of the showerhead and a back surface of the ion blocker plate; applying a bias comprising direct current (DC) or low frequency radio frequency (LFRF) to the ion blocker plate; and modulating the bias to achieve no light-up conditions in the processing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
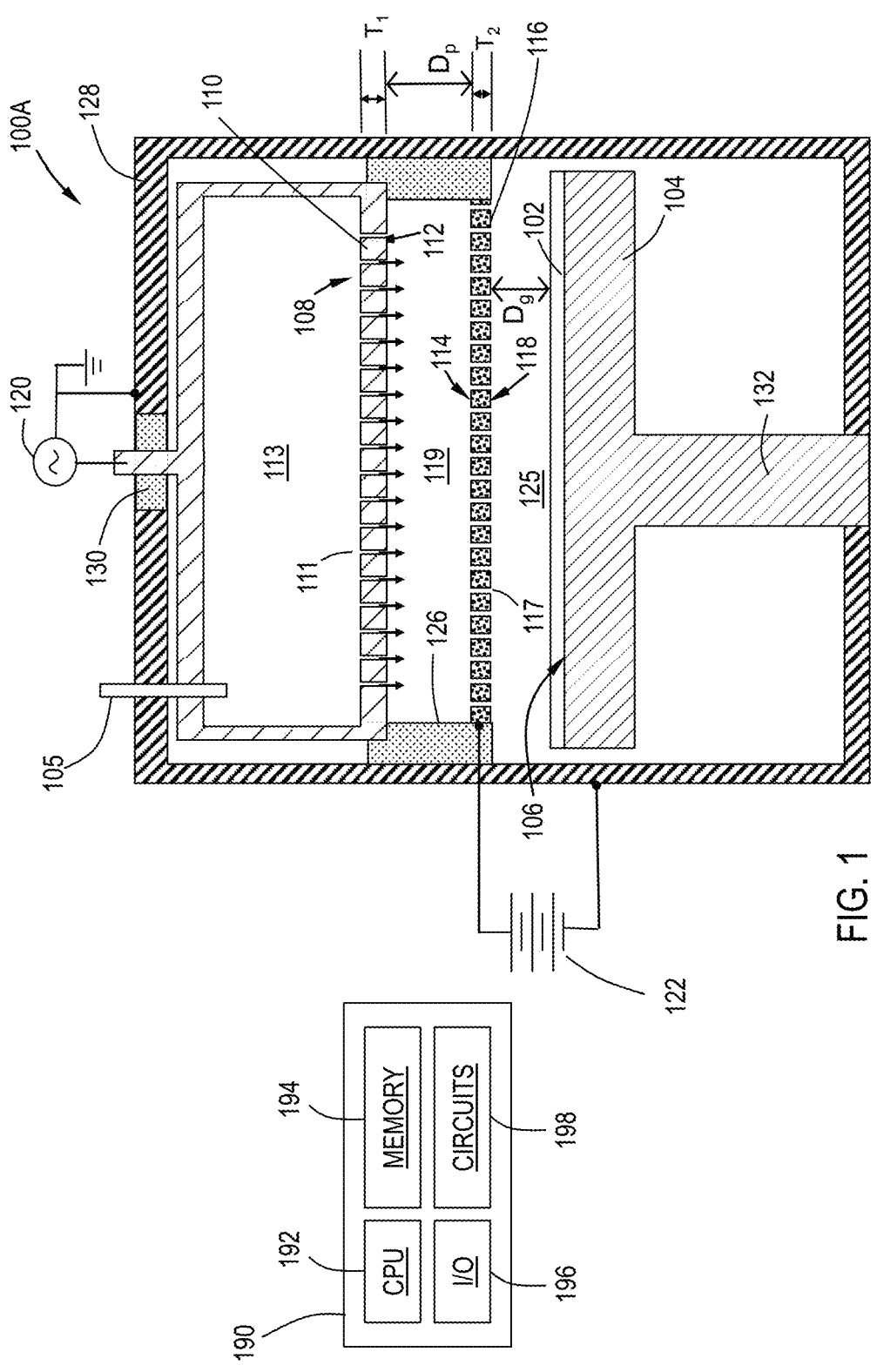
FIG. 1 shows a cross-sectional schematic view of a processing chamber in accordance with one or more embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label. The cross-hatch shading of the components in the figures are intended to aid in visualization of different parts and do not necessarily indicate different materials of construction.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

To address "light-up" during plasma-enhanced processes, including plasma-enhanced atomic layer deposition (PE-ALD) processes, plasma is electrically confined in a plasma region between a showerhead and an ion blocker plate. The ion blocker plate is dynamically tuned to mitigate and/or eliminate light-up during plasma processes, which results in improved plasma uniformity and overall process quality and yield. By biasing the ion blocker plate, radio frequency (RF) power leakage into a process volume or gap below is prevented. Accordingly, operating windows of processes can be expanded for fixed hardware configurations.

Confining plasma in the plasma region between the showerhead and the ion blocker plate is achieved applying direct current (DC) or low frequency radio frequency LFRF power bias to the blocker plate. DC or LFRF increases a sheath thickness that prevents plasma from penetrating into holes of the ion blocker plate. The "sheath" refers to an electron-depleted region near a surface. In one or more embodiments, the methods herein result in a sheath near surfaces of the ion-blocker plate. In particular, by electrically confining charged species, power to the plasma is not reduced. Advantageously, the charged species are confined while radicals flow unhindered. Therefore, light-up in the processing chamber, specifically ion blocker plate hole light-up, is mitigated and/or prevented. DC or LFRF bias is applied to tune to a no light-up plasma regime widening operating window. In one or more embodiments, the bias is tuned dynamically in that for a set of operating conditions for film deposition, the bias is adjusted during operation. In one or more embodiments, the bias of the ion blocker plate is relative to the chamber wall or housing.

Embodiments herein are directed to apparatus and methods for generating plasma for semiconductor processes and depositing films. Some embodiments provide an increase in radicals (e.g., oxygen radicals) for plasma processing methods. Some embodiments advantageously provide methods to reduce defects and improve flowability in flowable film deposition processes.

In one or more embodiments, plasma is generated for plasma-enhanced ALD. In one or more embodiments, the ALD process is conducted at high frequency at a power range of 400 W to 2500 W. In one or more embodiments, the high frequency is in a range of 3 MHz to 30 MHz. In one or more embodiments, the processing chamber is configured as a capacitively coupled plasma chamber.

Advantageously, the plasma regions herein are defined by a front surface of the showerhead and a back surface of the ion blocker plate. In one or more embodiments, the ion blocker plate is in direct proximity to the plasma generation region (e.g., plasma cavity) from process region. In this way, the ion blocker plate next to the plasma cavity allows radicals to flow to a process gap without any additional hindrance (e.g., hindrance and radical loss due to another structure, e.g., a showerhead), which leads to improved process efficiency. In addition, the ions are controlled using DC or LFRF applied to the ion blocker plate directly, which is an effective method without reliance on adjustments to or features of any other structure (e.g. a showerhead).

Figure 2:
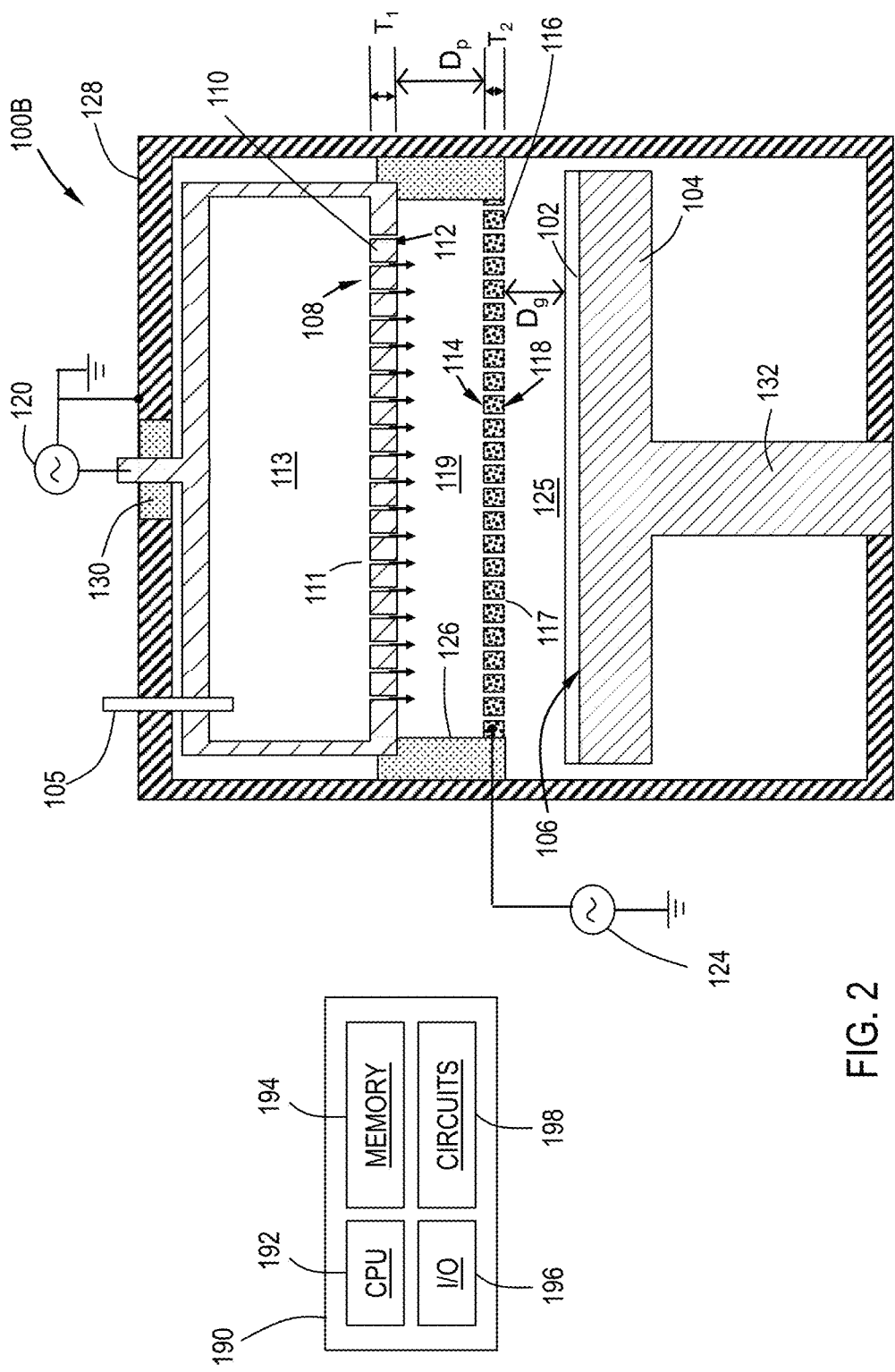
FIG. 2 shows a cross-sectional schematic view of a processing chamber in accordance with one or more embodiments.

Turning to FIGS. 1 and 2, one or more embodiments provide processing chambers 100A or 100B. The relative sizes and dimensions are not to scale, having been exaggerated and altered for illustrative and descriptive purposes and should not be taken as limiting the scope of the disclosure. The processing chambers 100A or 100B include a housing 128, a showerhead 110, an ion blocker plate 116, a substrate support 104, a power supply 120, a ceramic isolator 130, and a ceramic ring 124. In one or more embodiments, the power supply 120 is a high frequency radio frequency (HF RF) power supply.

The showerhead 110 has a front surface 112 and a back surface 108, between which defines an overall thickness ($T_1$) of the showerhead 110. The back surface 108 of the showerhead 110 in combination with other internal surfaces of the showerhead 110 define a plenum 113 in fluid communication with an inlet 105. The showerhead 110 includes a plurality of apertures 111 that extend from the back surface 108 through to the front surface 112 of the showerhead 110. The illustrated embodiment shows the plurality of apertures 111 in fluid communication with the plenum 113 so that a gas flowing through the inlet 105 enters the plenum and diffuses through the apertures 111 in the direction of the arrows into a plasma cavity 119 defined by the front surface 112 of the showerhead 110 and a back surface 114 of the ion blocker plate 116, the plasma cavity 119 spanning a distance $D_p$.

In the illustrated embodiments, each of the apertures 111 has a back opening in at a junction of the back surface 108 and the plenum 113 and a front opening at a junction of the front surface 112 and the plasma cavity 119.

The showerhead 110 illustrated may be referred to as a single channel showerhead. To pass through the showerhead 110, a gas must flow through the apertures 111, creating a single flow path. The skilled artisan will recognize that this is merely one possible configuration, and should not be taken as limiting the scope of the disclosure. Showerheads may be as a dual channel showerhead in which there are two separate flow paths for a species to pass through the showerhead so that the species do not mix until emerging from the showerhead into the plasma cavity 119.

The ion blocker plate 116 has the back surface 114 and a front surface 118, between which defines an overall thickness ($T_2$) of the ion blocker plate 116. The ion blocker plate 116 includes a plurality of openings 117 that extend from the back surface 114 through to the front surface 118 of the ion blocker plate 116. The illustrated embodiment shows the plurality of openings 117 providing fluid communication between the plasma cavity 119 and a process gap 125, whose distance spans a gap distance $D_g$.

In the illustrated embodiments, each of the openings 117 has a back opening in at a junction of the back surface 114 and plasma cavity 119 and a front opening at a junction of the front surface 118 and the process gap 125.

The substrate support 104 includes a substrate support surface 106 configured to support a substrate or wafer 102 during processing. The substrate support 104 may be connected to a support shaft 132. The support shaft 132 can be integrally formed with the substrate support 104 or can be a separate component from the substrate support 104. The support shaft 132 of some embodiments is configured to rotate around a central axis of the substrate support 104. In some embodiments, the support shaft 132 is configured to move the support surface 106 closer to or further away from the front surface 118 of the ion blocker plate 116.

During use, the process gap 125 is defined by a top surface of the wafer 102, which is spaced the gap distance $D_g$ from the front surface 118 of the ion blocker plate 116 so that the flow of plasma from the plasma cavity 119 contacts the wafer 102 positioned on the support surface 106. In one or more embodiments, the processing chamber 100 is configured to deposit films by ALD.

The power supply 120 is a radio frequency (RF) power supply, in particular a high frequency (HF) RF supply used to power an electrode of the processing chamber. In one or more embodiments, the electrode is the showerhead 110, to which power is supplied to generate a plasma. Ceramic ring 124 electrically isolates the showerhead 110 and the ion blocker plate 116 from the housing 128. Ceramic isolator 130 electrically isolates the power supply 120 from the housing 128.

In the embodiment of FIG. 1, a direct current (DC) power source 122 is used to apply a bias to the ion blocker plate 116. The DC power source 122 can be any suitable component known to the skilled artisan that can supply DC power to the ion blocker plate 116. The DC power source 122 is connected to the ion blocker plate 116 and grounded to the housing 128 by any suitable connectors known to the skilled artisan.

In one or more embodiments, the DC power source 122 is configured to deliver a direct current (DC) bias of the ion blocker plate in a range of ±50V to ±200V.

In the embodiment of FIG. 2, a power supply 124, in particular, a low frequency (LF) radio frequency (RF) power supply, is used to apply a bias to the ion blocker plate 116. The LF RF power supply 124 can be any suitable component known to the skilled artisan that can supply power to the ion blocker plate 116. The LF RF power supply 124 is connected to the ion blocker plate 116 by any suitable connectors known to the skilled artisan.

In one or more embodiments, the power supply 124 is configured to deliver a low frequency radio frequency (LF RF) bias of the ion blocker plate in a range of greater than or equal to 2 W to less than or equal to 50 W at a frequency in a range of 100 kHz to 500 kHz.

Figures 3A, 3B, 3C:
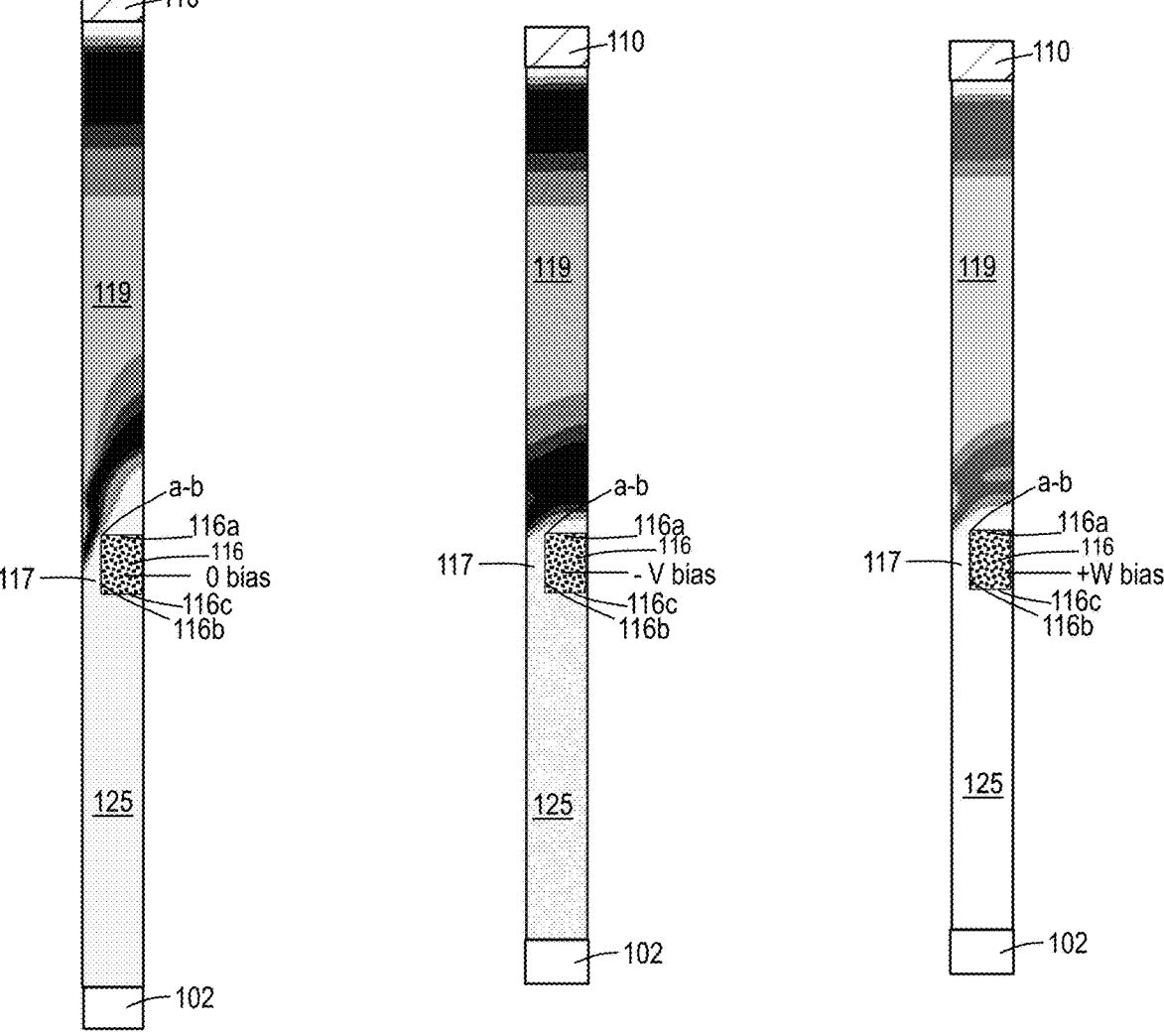
FIGS. 3A-3C show schematic views of a slice of a cross-section of exemplary processing chambers positioned from showerhead to ion blocker plate to wafer with a depiction of plasma distribution by electron density in accordance with a comparative example (FIG. 3A) and one or more embodiments (FIGS. 3B-3C)

Turning to FIGS. 3A-3C, schematic views are provided of a slice of a cross-section of the processing chamber from showerhead 100 to ion blocker plate 116 to wafer 102 with a depiction of plasma distribution by electron density in accordance with a comparative example (FIG. 3A) and one or more embodiments (FIGS. 3B-3C). A darker shade indicates a higher electron density. A lighter shade indicates a lower density. In FIGS. 3A-3C, ion blocker plate 116 has a first surface 116a, which is part of a back surface of the ion blocker plate 116 positioned in plasma cavity 119; a second surface 116b, which partially defines ion blocker plate opening 117; and third surface 116c, which part of a front surface of the ion blocker plate 116 positioned in process gap 125. Corner "a-b" is at the junction of the first surface 116a and the second surface 116b. An area or thickness of sheath, which is an electron-depleted region near at a surface, is an indication of an effect of the bias. For illustrative purposes, in FIGS. 3A-3C, the sheath at corner a-b is observed, but it is understood that sheath with respect to portions or all of first surface 116a, second surface 116b, and/or third surface 116c could be used for comparison for other conditions. In FIG. 3A of a comparative example (no bias), a plasma is generated under a base set of conditions for an ALD processing chamber (power range, frequency, pressure, ion blocker hole size, and ion blocker thickness). Plasma density in the plasma cavity 119 can be modeled by using an electron distribution as a basis. The illustration of FIG. 3A, which is for no bias conditions, yields "light-up" conditions where electrons leak into the opening 117 of the ion blocker plate 116. At corner a-b of FIG. 3A, there is a negligible sheath in that the electron density is close to the corner a-b. In FIG. 3B, for the same ALD conditions as FIG. 3A, a negative voltage bias is applied to the ion blocker plate 116 which results in an increase of sheath thickness at corner a-b as compared to FIG. 3A, which inhibits ions from penetrating into the opening 117 the ion blocker plate 116. FIG. 3B depicts a condition of no light-up. In FIG. 3C, for the same ALD conditions as FIG. 3A, a LFRF power is applied to the ion blocker which results in an increase of sheath thickness at corner a-b as compared to FIG. 3A, which inhibits ions from penetrating into the opening 117 the ion blocker plate 116. FIGS. 3B and 3C depict conditions of no light-up.

With further respect to FIGS. 1-2, the processing chamber 100A or 100B includes one or more gas inlets 105. The gas inlet 105, which can be used for both plasma and non-plasma gases, is in fluid communication with the plenum 113. The plasma gas (gas to become a plasma) flows through the showerhead 110 into the plasma cavity 119, is ignited into the plasma, and flows into the process gap 125 through the ion blocker plate 116. After a plasma exposure, a non-plasma gas may be flowed through the plasma cavity 119 without igniting a plasma to allow the non-plasma based species to enter the process gap 125. In some embodiments, the processing chamber has a gas inlet in the body of the chamber (e.g., the sidewall, top or bottom).

In some embodiments, radicals are provided to the process gap 125 using the ion blocker plate 116 to decrease the amount of ions present in the plasma from reaching the process gap 125. In some embodiments, a plasma is generated in the plasma cavity 119 using a RF power source 120. The plasma will have an amount of ions and an amount of radicals.

In one or more embodiments, the plasma can be generated by capacitively coupled plasma. In some embodiments, the plasma is a capacitively coupled plasma generated in the plasma cavity 119 by applying RF power to create a differential between the housing/ground 128 and the showerhead 110.

The plasma generated in the plasma cavity 119 can include any suitable reactive gases in which radicals, rather than ions, are used for reaction. In some embodiments, the plasma gas comprises one or more of molecular oxygen ($O_2$), molecular nitrogen ($N_2$), helium (He), molecular hydrogen ($H_2$), neon (Ne), argon (Ar) or krypton (Kr).

The ion blocker plate 116 is biased to prevent or minimize the quantity of ions from the plasma from passing through openings 117. That is, the amount of ions passing through the openings 117 decreases upon application of the bias. The ion blocker plate 116 generates a flow of radicals that, according to some embodiments, is substantially free of ions. As used in this manner, the term "substantially free of ions" means that the ion composition entering the process gap 125 is less than or equal to about 10%, 5%, 2%, 1%, 0.5% or 0.1% of the quantity of radicals entering the process gap 125.

Because the ions of the plasma are charged, the biased ion blocker plate 116 acts as a barrier to ion passage through the openings 117. Whereas the radicals are uncharged, the biased ion blocker plate 116 has a minimal, if any, impact on the movement of the radicals through the openings 117 so that the radicals can pass through the ion blocker plate 116 and into the process gap 125.

The ion blocker plate 116 can be made of any suitable material having any suitable thickness. In some embodiments, the ion blocker plate 116 comprises aluminum or stainless steel. In some embodiments, the ion blocker plate 116 has a thickness T in the range of about 20 mil (0.5 mm) to about 2 inches (50 mm), or in the range of about 1 mm to about 25 mm, or in the range of about 2 mm to about 20 mm, or in the range of about 3 mm to about 15 mm, or in the range of about 4 mm to about 10 mm.

The openings 117 in the ion blocker plate 116 can have a uniform width or can be varied in width. In some embodiments, the openings 117 have diameters that vary depending on location within the ion blocker plate 116. For example, in some embodiments, the openings 117 in the ion blocker plate 116 may be larger around the outer peripheral edge of the ion blocker plate 116 than the openings in the center of the ion blocker plate 116. In some embodiments, the width (or diameter for a circular opening) of any given opening 117 varies through the thickness T of the ion blocker plate 116. In some embodiments, the openings 117 are circular and have a size or diameter in the range of about 20 mil (0.5 mm) to about 0.5 inches (12.7 mm), and all values and subranges therebetween.

The processing chambers 110A or 110B optionally comprise further components, not shown, as-needed. For example, the processing chambers 110A or 110B may further comprise: one or more of a vacuum outlet, and a purge gas inlet defining an outer periphery of the process gap 125. In this way, the processing chamber may further comprise a "gas curtain" that inhibits and/or prevents process gases from within the process gap 125 from migrating from the process gap 125 into the other areas of the process chamber 110A or 110B.

Figure 4:
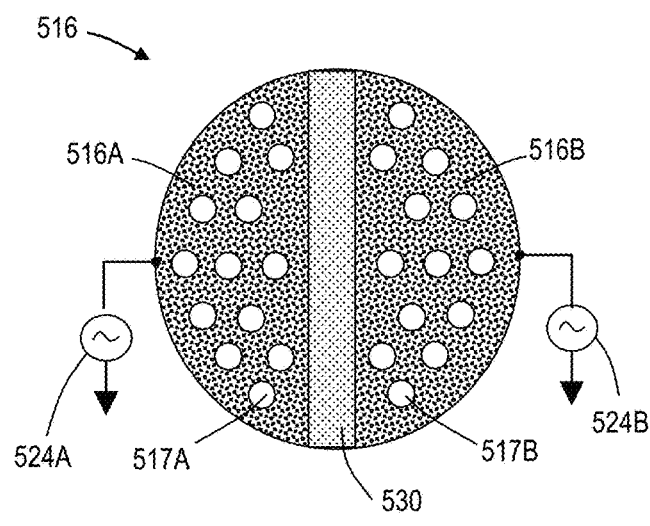
FIG. 4 is a top schematic view of an ion blocker plate in accordance with one or more embodiments.

In one or more embodiments, the bias is applied zonally. FIG. 4 is a top schematic view of an ion blocker plate 516 in accordance with one or more embodiments. The ion blocker plate 516 is divided into two zones, a first zone 516A having openings 517A, and a second zone 516B having openings 517B, whose biases are independently controllable. LF RF power supply 524A biases the first zone 516A;

and LF RP power supply 524B biases the second zone 516B. A ceramic isolator 530 provides electrical isolation between the first zone 516A and the second zone 516B. In this embodiment, the ceramic isolator 530 traverses the ion blocker plate from edge-to-edge, along a diameter of the ion blocker plate 516.

For non-limiting illustration purposes, FIG. 4 has two zones. It is understood that two or more zones could be used.

For non-limiting illustration purposes, FIG. 4 is using LF RF as the bias. It is further understood that zonally applied bias may use DC as the bias.

Figure 5:
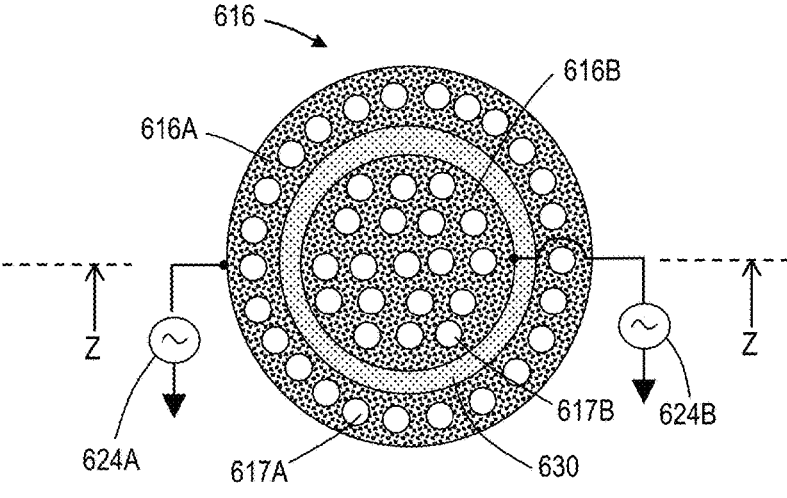
FIG. 5 is a top schematic view of an ion blocker plate in accordance with one or more embodiments.
Figure 6:
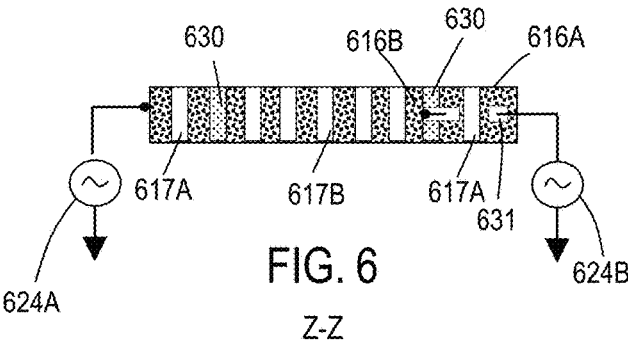
FIG. 6 is a cross-section schematic view of line Z-Z of FIG. 5.

FIG. 5 is a top schematic view of an ion blocker plate 616 in accordance with one or more embodiments. The ion blocker plate 616 is divided into two zones, a first zone 616A having openings 617A, and a second zone 616B having openings 617B, whose biases are independently controllable. LF RF power supply 624A biases the first zone 616A; and LF RP power supply 624B biases the second zone 6168. A ceramic isolator 630 provides electrical isolation between the first zone 616A and the second zone 616B. In this embodiment, the first zone 616A, the ceramic isolator 630, and the second zone 616B are axially-arranged. FIG. 6 is a cross-section schematic view of line Z-Z of FIG. 5, providing details for providing LR RF power from 324B to the second zone 616B from an outside edge of ion blocker plate 616 through a channel 631 in the first zone 616A and the ceramic isolator 630.

For non-limiting illustration purposes, FIG. 5 has two zones. It is understood that two or more zones could be used.

For non-limiting illustration purposes, FIG. 5 is using LF RF as the bias. It is further understood that zonally applied bias may use DC as the bias.

In one or more embodiments, the processing chamber comprises a controller of the processing chamber, wherein the controller is capable of executing instructions from a non-transitory computer readable medium, that, when executed by the controller, applies a bias to the ion blocker plate.

Referring again to FIGS. 1-2, some embodiments include a controller 190 coupled to various components of the processing chamber 100A or 100B to control the operation thereof. The controller 190 of some embodiments controls the entire processing chamber (not shown). In some embodiments, the processing chamber 100 includes multiple controllers, of which controller 190 is a part; each controller is configured to control one or more individual portions of the processing chamber. For example, the processing chamber of some embodiments comprises separate controllers for one or more of the process gas flow into the showerhead, purge gas flow, vacuum pressure, process gap size, temperature control, and/or actuators. Further, the processing chamber 100A or 100B of some embodiments comprises a separate controller for the power supply 120 and/or the DC source 122 or the LF RF power supply 124. A controller may also be used to regulate bias for zonal application to independently control two or more DC sources or LF RF power supplies.

The controller 190 may be one of any form of general-purpose computer processor, microcontroller, microprocessor, etc., that can be used in an industrial setting for controlling various chambers and sub-processors. The at least one controller 190 of some embodiments has a processor 192, a memory 194 coupled to the processor 192, input/output devices 196 coupled to the processor 192, and support circuits 198 to communication between the different electronic and physical components. The memory 194 of some embodiments includes one or more of transitory memory (e.g., random access memory) and non-transitory memory (e.g., storage).

The memory 194, or a computer-readable medium, of the processor may be one or more of readily available memory such as random access memory (RAM), read-only memory (ROM), floppy disk, hard disk, or any other form of digital storage, local or remote. The memory 194 can retain an instruction set that is operable by the processor 192 to control parameters and components of the system. The support circuits 198 are coupled to the processor 192 for supporting the processor in a conventional manner. Circuits may include, for example, cache, power supplies, clock circuits, input/output circuitry, subsystems, and the like. Circuits also include motors, actuators, gauges (e.g., thermocouple, pyrometer, manometers), valves, etc., that are used to operate the process chamber and control the components that support the methods.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Figure 7:
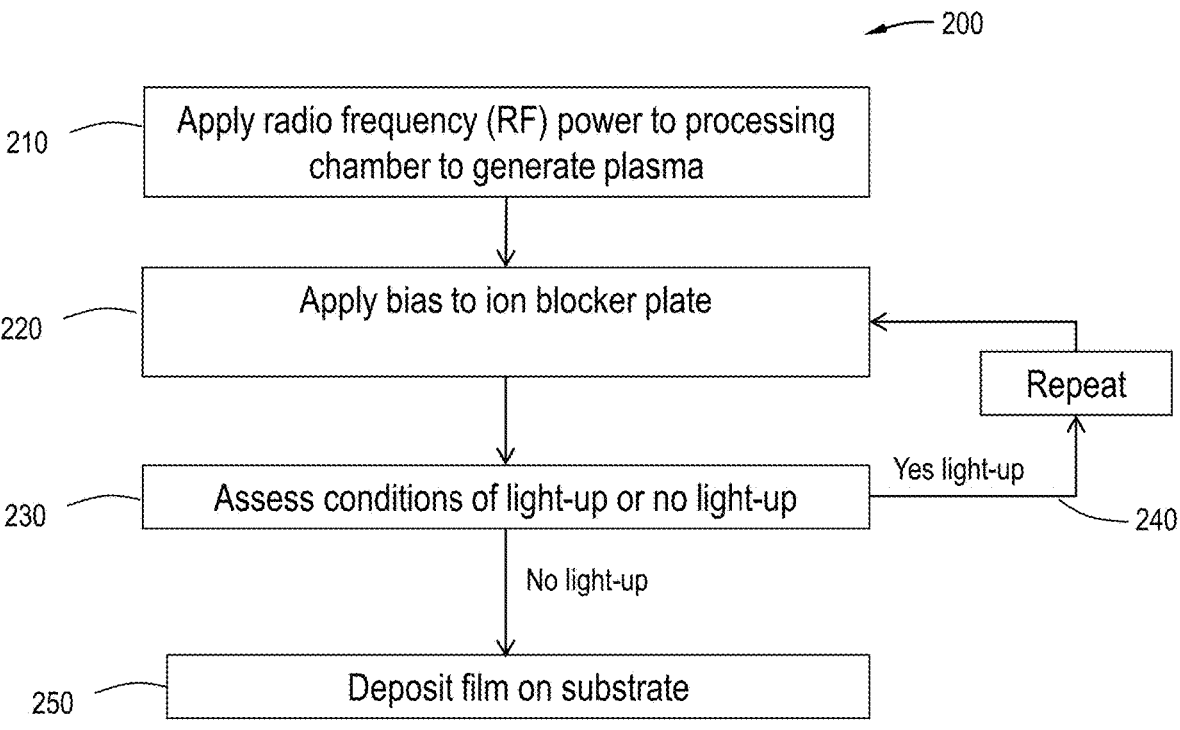
FIG. 7 shows a flowchart of a method of generating a plasma in accordance with one or more embodiments.

FIG. 7 shows a shows a flowchart of a method 200 of generating a plasma in accordance with one or more embodiments. At operation 210, a radio frequency (RF) power is applied to a processing chamber to generate a plasma in a plasma region of the processing chamber. At operation 220, a bias is applied to the ion blocker plate. At operation 230, conditions of light-up or no light-up are assessed. At operation 240, if there is light-up, then the bias is adjusted, re-applied. At operation 250, if there is no light-up then a semiconductor film deposition process, e.g., PE-ALD proceeds.

In one or more embodiments, instructions executed by a controller of a processing chamber, causes the processing chamber to perform operations of: applying a radio frequency (RF) power to a showerhead of the processing chamber to generate a plasma in a plasma region of the processing chamber, the processing chamber containing: the showerhead, an ion blocker plate, and a substrate, the plasma region being defined by a front surface of the showerhead and a back surface of the ion blocker plate; applying a bias comprising direct current (DC) or low frequency radio frequency (LFRF) to the ion blocker plate; and modulating the bias to achieve no light-up conditions in the processing chamber. In one or more embodiments, the modulating of the bias comprises dynamically tuning the bias by assessing conditions of light-up or no light-up and adjusting the bias. In one or more embodiments, the bias is applied zonally.

Figure 8:
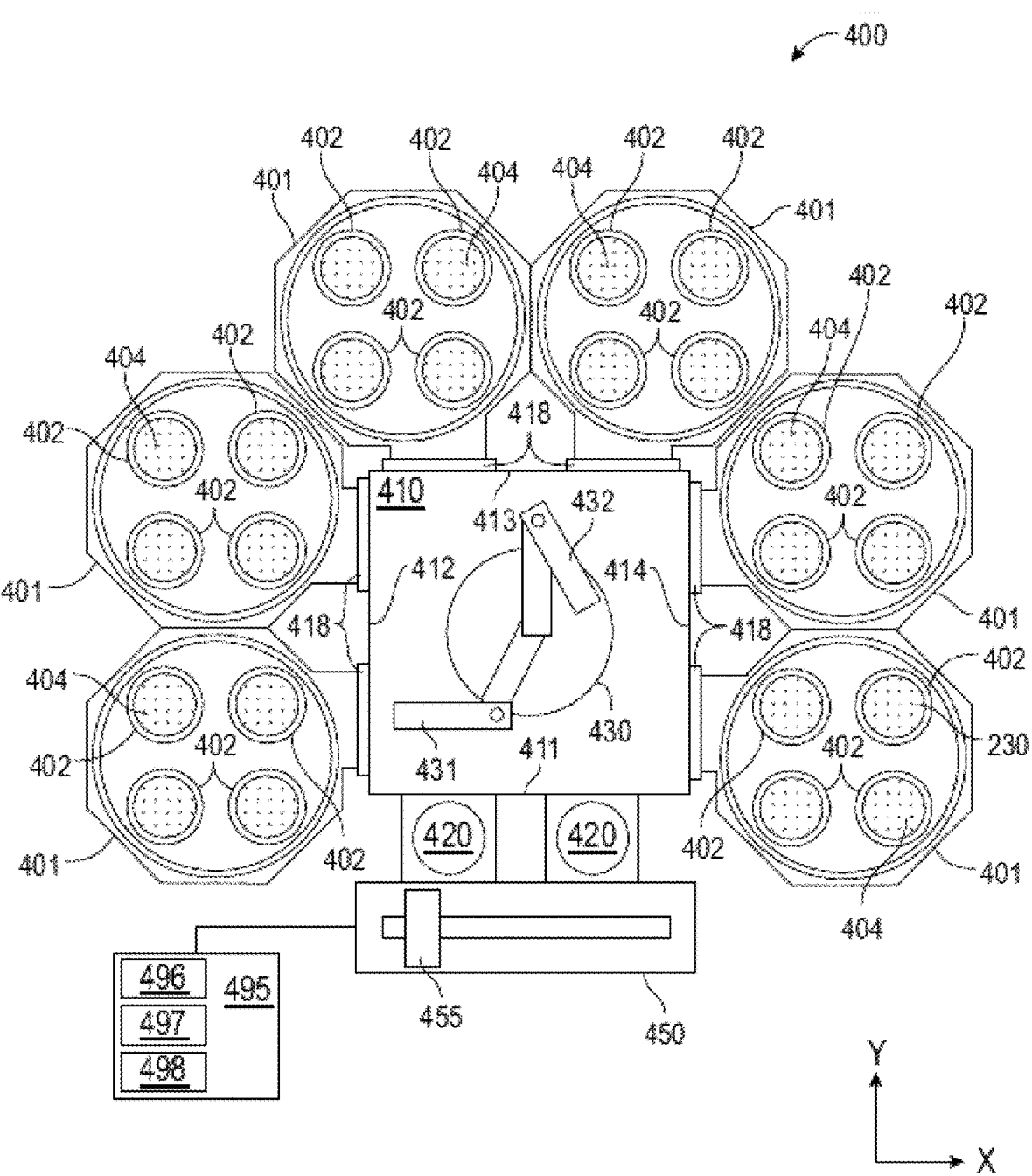
FIG. 8 is a schematic representation of a processing platform in accordance with one or more embodiments.

FIG. 8 shows a processing platform 400 in accordance with one or more embodiments. The embodiment shown in FIG. 4 is merely representative of one possible configuration and should not be taken as limiting the scope of the disclosure. For example, in some embodiments, the processing platform 400 has a different number of one or more of the processing chambers 401, buffer stations 420 and/or robot 430 configurations than the illustrated embodiment. Each of the processing chambers 401 has a plurality of process stations 402. Each of the processing stations 402 comprises a substrate support surface 404. In one or more embodiments, each of the processing stations 402 further comprises three main components: a top plate (also called a lid), a pump/purge insert, and a gas injector.

The exemplary processing platform 400 includes a central transfer station 410 which has a plurality of sides 411, 412, 413, 414. The transfer station 410 shown has a first side 411, a second side 412, a third side 413 and a fourth side 414. Although four sides are shown, those skilled in the art will understand that there can be any suitable number of sides to the transfer station 410 depending on, for example, the overall configuration of the processing platform 400. In some embodiments, there the transfer station 410 has three sides, four sides, five sides, six sides, seven sides or eight sides.

The transfer station 410 has a robot 430 positioned therein. The robot 430 can be any suitable robot capable of moving a substrate during processing. In some embodiments, the robot 430 has a first arm 431 and a second arm 432. The first arm 431 and second arm 432 can be moved independently of the other arm. The first arm 431 and second arm 432 can move in the x-y plane and/or along the z-axis. In some embodiments, the robot 430 includes a third arm (not shown) or a fourth arm (not shown). Each of the arms can move independently of other arms.

The embodiment illustrated includes six processing chambers 401 with two connected to each of the second side 412, third side 413 and fourth side 414 of the central transfer station 410. Each of the processing chambers 401 can be configured to perform different processes.

The processing platform 400 can also include one or more buffer station 420 connected to the first side 411 of the central transfer station 410. The buffer stations 420 can perform the same or different functions. For example, the buffer stations may hold a cassette of substrates which are processed and returned to the original cassette, or one of the buffer stations may hold unprocessed substrates which are moved to the other buffer station after processing. In some embodiments, one or more of the buffer stations are configured to pre-treat, pre-heat or clean the substrates before and/or after processing.

The processing platform 400 may also include one or more slit valves 418 between the central transfer station 410 and any of the processing chambers 401. The slit valves 418 can open and close to isolate the interior volume within the processing chamber 401 from the environment within the central transfer station 410. For example, if the processing chamber will generate plasma during processing, it may be helpful to close the slit valve for that processing chamber to prevent stray plasma from damaging the robot in the transfer station.

The processing platform 400 can be connected to a factory interface 450 to allow substrates or cassettes of substrates to be loaded into the processing platform 400. A robot 455 within the factory interface 450 can be used to move the substrates or cassettes into and out of the buffer stations. The substrates or cassettes can be moved within the processing platform 400 by the robot 430 in the central transfer station 410. In some embodiments, the factory interface 450 is a transfer station of another cluster tool (i.e., another multiple chamber processing platform).

A controller 495 may be provided and coupled to various components of the processing platform 400 to control the operation thereof. The controller 495 can be a single controller that controls the entire processing platform 400, or multiple controllers that control individual portions of the processing platform 400. For example, the processing platform 400 of some embodiments comprises separate controllers for one or more of the individual processing chambers 401, central transfer station 410, factory interface 450 and/or robots 430.

In some embodiments, the processing chamber 401 further comprises a controller 495 connected to the plurality of substantially coplanar support surfaces 404 configured to control one or more of the first temperature or the second temperature.

In some embodiments, the controller 495 includes a central processing unit (CPU) 496, a memory 497, and support circuits 498. The controller 495 may control the processing platform 400 directly, or via computers (or controllers) associated with particular process chamber and/or support system components.

The controller 495 may be one of any form of general-purpose computer processor that can be used in an industrial setting for controlling various chambers and sub-processors. The memory 497 or computer readable medium of the controller 495 may be one or more of readily available memory such as random access memory (RAM), read only memory (ROM), floppy disk, hard disk, optical storage media (e.g., compact disc or digital video disc), flash drive, or any other form of digital storage, local or remote. The memory 497 can retain an instruction set that is operable by the processor (CPU 496) to control parameters and components of the processing platform 400.

The support circuits 498 are coupled to the CPU 496 for supporting the processor in a conventional manner. These circuits include cache, power supplies, clock circuits, input/output circuitry and subsystems, and the like. One or more processes may be stored in the memory 498 as software routine that, when executed or invoked by the processor, causes the processor to control the operation of the processing platform 400 or individual processing chambers in the manner described herein. The software routine may also be stored and/or executed by a second CPU (not shown) that is remotely located from the hardware being controlled by the CPU 496.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 495 has one or more configurations to execute individual processes or sub-processes to perform the method. The controller 495 can be connected to and configured to operate intermediate components to perform the functions of the methods. For example, the controller 495 can be connected to and configured to control one or more of gas valves, actuators, motors, slit valves, vacuum control or other components.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of generating a plasma in a semiconductor processing chamber, the method comprising:
   processing a substrate in the semiconductor processing chamber including a housing;
   applying a radio frequency (RF) power from a power source to generate a plasma in a plasma region of the processing chamber, the processing chamber containing: a showerhead having a front surface and a back surface located below a plenum and a plurality of apertures in fluid communication with the plenum, an ion blocker plate, and the substrate, and the plasma region defined by the front surface of the showerhead and a back surface of the ion blocker plate; and
   applying a bias to the ion blocker plate to mitigate light-up in the ion blocker plate.

2. The method of claim 1, wherein applying the bias is effective to electrically confine ions of the plasma in the plasma region and prevent light-up in the ion blocker plate.

3. The method of claim 1, the method further comprising dynamically tuning the bias during a deposition process by assessing conditions of light-up or no light-up and adjusting the bias.

4. The method of claim 1, wherein the power is connected to the ion blocker plate and grounded to the housing.

5. The method of claim 1, wherein applying the bias comprises delivering a direct current (DC) bias of the ion blocker plate in a range of ±50V to ±200V.

6. The method of claim 1, wherein applying the bias comprises delivering a low frequency radio frequency (LFRF) bias of the ion blocker plate in a range of greater than or equal to 2 W to less than or equal to 50 W at a frequency in a range of 100 kHz to 500 KHz.

7. The method of claim 1, wherein the plasma is generated during an atomic layer deposition (ALD) process operating at a power range of 400 W to 2500 W, and the method further comprises depositing a film on the substrate.

8. The method of claim 1, wherein the ion blocker plate comprises openings having a size in a range of greater than or equal to 20 mil (0.5 mm) to less than or equal to 0.5 inches (12.7 mm), and/or a thickness in a range of greater than or equal to 20 mil (0.5 mm) to less than or equal to 2 inches (50 mm).

9. A method of generating a plasma in a semiconductor processing chamber including a housing, the method comprising:
   applying a radio frequency (RF) power from a power source to a showerhead of the processing chamber to generate a plasma in a plasma region of the processing chamber, the processing chamber containing: the showerhead having a front surface and a back surface located below a plenum and a plurality of apertures in fluid communication with the plenum, an ion blocker plate, and the substrate, the plasma region being defined by the front surface of the showerhead and a back surface of the ion blocker plate;

applying a bias comprising direct current (DC) or low frequency radio frequency (LFRF) to the ion blocker plate; and modulating the bias to mitigate light-up in the ion blocker plate.

10. The method of claim 9, wherein the modulating of the bias comprises dynamically tuning the bias during a deposition process by assessing conditions of light-up or no light-up and adjusting the bias.

11. The method of claim 9, wherein the power is connected to the ion blocker plate and grounded to the housing.

12. The method of claim 9, wherein applying the bias comprises delivering a direct current (DC) bias of the ion blocker plate in a range of ±50V to ±200V.

13. The method of claim 9, wherein applying the bias comprises delivering a low frequency radio frequency (LFRF) bias of the ion blocker plate in a range of greater than or equal to 2 W to less than or equal to 50 W at a frequency in a range of 100 kHz to 500 KHz.

14. The method of claim 9, wherein the plasma is generated during an atomic layer deposition (ALD) process operating at a power range of 400 W to 2500 W, and the method further comprises depositing a film on the substrate.

15. The method of claim 9, wherein the ion blocker plate comprises openings having a size in a range of greater than or equal to 20 mil (0.5 mm) to less than or equal to 0.5 inches (12.7 mm), and/or a thickness in a range of greater than or equal to 20 mil (0.5 mm) to less than or equal to 2 inches (50 mm).

* * * * *